United States Patent [19]
Jeng et al.

[11] Patent Number: 6,103,588
[45] Date of Patent: *Aug. 15, 2000

[54] METHOD OF FORMING A CONTACT HOLE IN A SEMICONDUCTOR DEVICE

[75] Inventors: Erik S. Jeng; Bi-Ling Chen; Hao-Chieh Liu, all of Taipei, Taiwan

[73] Assignee: Vanguard International Semiconductor Corporation, Hsinchu, Taiwan

[*] Notice: This patent is subject to a terminal disclaimer.

[21] Appl. No.: 09/122,307

[22] Filed: Jul. 24, 1998

[51] Int. Cl.$^7$ .................................................. H01L 21/20
[52] U.S. Cl. .......................... 438/399; 438/253; 438/254; 438/255; 438/256; 438/296; 438/298; 438/297; 438/637; 438/638; 438/639; 438/396; 438/397; 438/398; 438/399; 438/400
[58] Field of Search .................................... 438/253, 254, 438/255, 256, 296, 297, 298, 637, 638, 639, 396, 397, 399, 398, 400

[56] References Cited

U.S. PATENT DOCUMENTS

| | | | |
|---|---|---|---|
| 5,904,521 | 4/1999 | Jeng et al. | 438/253 |
| 6,015,983 | 1/2000 | Parekh | 257/296 |
| 6,033,966 | 3/2000 | Linliu | 438/396 |

*Primary Examiner*—Brian Dutton
*Assistant Examiner*—Brook Kebede
*Attorney, Agent, or Firm*—Christensen O'Connor Johnson Kindness PLLC

[57] ABSTRACT

The present invention includes forming a first conductive layer on a semiconductor substrate, and forming a first dielectric layer on the first conductive layer. After patterning to etch the first dielectric layer and the first conductive layer, a second dielectric layer is formed on the semiconductor substrate and the first dielectric layer. Next, the second dielectric layer is anisotropically etched back to form a spacer on sidewalls of the first dielectric layer and the first conductive layer. A first silicon oxide layer is then formed over the semiconductor substrate, the first dielectric layer, and the spacer, followed by forming a photoresist layer on the first silicon oxide layer. A predetermined thickness of the first silicon oxide layer is removed by using the photoresist layer as a mask, and a polymer layer is then formed on the photoresist layer and the first silicon oxide layer. The polymer layer is anisotropically etched back to form a polymer spacer on sidewalls of the photoresist layer and the first silicon oxide layer. The first silicon oxide layer is then anisotropically etched back by using the polymer spacer as a mask to expose surface of the semiconductor substrate, wherein the spacer and the first dielectric layer are used for facilitating self-aligned etching. A second conductive layer is formed over the semiconductor substrate, surface of the second silicon oxide layer being exposed, and a second silicon oxide layer is formed over the second conductive layer and the first silicon oxide layer. Finally, a portion of the second silicon oxide layer is patterned to expose a portion of the second conductive layer, thereby forming the contact hole in the second oxide layer.

19 Claims, 7 Drawing Sheets

METHOD OF FORMING A CONTACT HOLE IN A SEMICONDUCTOR DEVICE

FIELD OF THE INVENTION

The present invention relates to a method of forming a contact hole in a semiconductor device, and more particularly, to a method for forming a contact hole in a dynamic random access memory cell that substantially increases the landing area of the contact plug.

DESCRIPTION OF THE PRIOR ART

Recently, demand for semiconductor devices has rapidly increased owing to widespread use of electronic equipment. In particular, the increasing popularity of some electronic equipment such as computers, for example, is increasing the demand for large semiconductor memories.

Early DRAMs used storage cells each consisting of three transistors and were manufactured using P type channel metal-oxide-semiconductor (PMOS) technology. Later, a DRAM storage cell structure consisting of one transistor and one capacitor was disclosed.

As the semiconductor memory device becomes more highly integrated, the area occupied by a capacitor of a DRAM storage cell typically shrinks. Thus, the capacitance of the capacitor is reduced owing to its smaller electrode surface area. However, a relatively large capacitance is required to achieve a high signal-to-noise ratio in reading the memory cell and to reduce soft errors (due to alpha particle interference). Therefore, it is desirable to reduce the cell dimension and yet obtain a high capacitance, thereby achieving both high cell integration and reliable operation.

Figure 1:
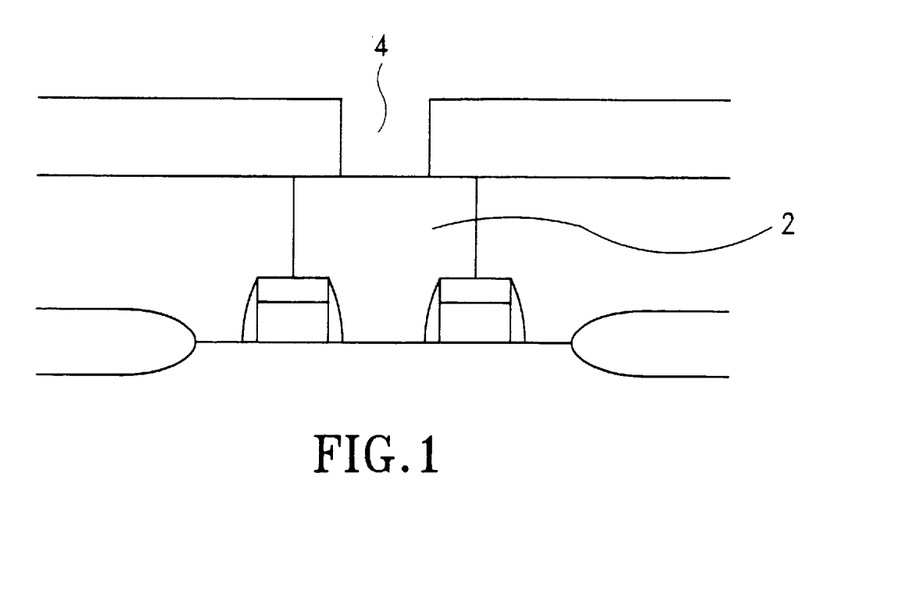
FIG. 1 shows a cross-sectional view illustrating a traditional self-aligned contact (SAC) structure.
Figure 2:
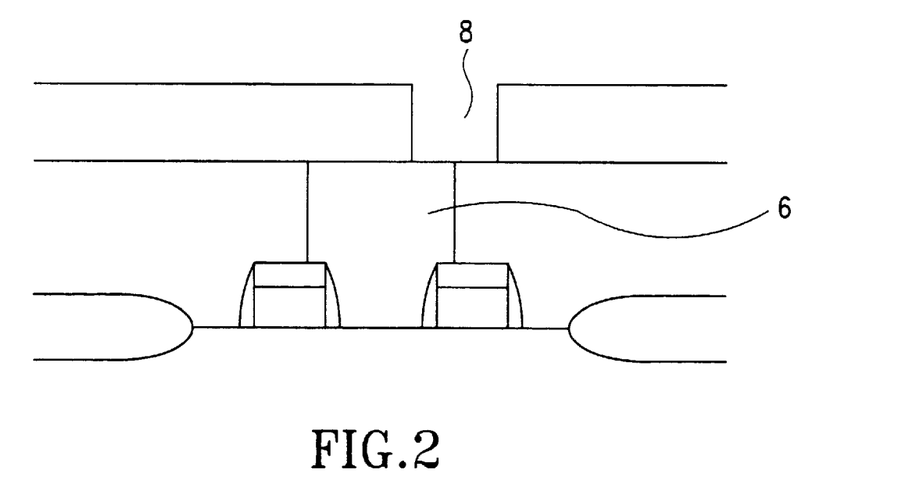
FIG. 2 shows a cross-sectional view illustrating another traditional self-aligned contact (SAC) structure.

One important feature of a DRAM cell are contact holes. As the semiconductor memory devices become more highly integrated, the landing area of the contact plug decreases, resulting in difficulties for fabricating the second landing contact and low contact yield. FIG. 1 shows a cross-sectional view illustrating a self-aligned contact (SAC) structure in the art, wherein the numerals 2 and 4 designate a plug and a contact hole, respectively. As this structure possesses a large SAC contact ($\phi$0.35 $\mu$m), it results in poor silicon nitride (SiN) corner selectivity during etching. FIG. 2 shows a cross-sectional view illustrating another self-aligned contact (SAC) structure in the art, wherein the numerals 6 and 8 designate a plug and a contact hole, respectively. This structure has a smaller SAC contact ($\phi$0.25 $\mu$m), and, therefore, has less tolerance of second landing contact mis-alignment to the contact plug.

Accordingly, there is a need for a method of forming a DRAM capacitor having a landing contact plug with large contact area to improve resistance and mis-alignment.

SUMMARY OF THE INVENTION

In accordance with the present invention, a method is provided for forming a contact hole of a DRAM cell that substantially increases the landing area of the contact plug. In one embodiment, a first conductive layer is formed on a semiconductor layer, and a first dielectric layer is formed atop the first conductive layer. After patterning to etch the first dielectric layer and the first conductive layer, a second dielectric layer is formed on the semiconductor layer and the first dielectric layer. Next, the second dielectric layer is anisotropically etched back to form a spacers on the sidewalls of the first dielectric layer and the first conductive layer. A first silicon oxide layer is then formed over the semiconductor layer, the first dielectric layer, and the spacers, followed by forming a photoresist layer on the first silicon oxide layer. A predetermined thickness of the first silicon oxide layer is removed by using the photoresist layer as a mask, and a polymer layer is then formed on the photoresist layer and the first silicon oxide layer, wherein the polymer layer forming and the oxide etching are performed in the same chamber. The polymer layer is anisotropically etched back to form polymer spacers on the sidewalls of the photoresist layer and the first silicon oxide layer. The first silicon oxide layer is then anisotropically etched back by using the polymer spacer as a mask to expose surface of the semiconductor layer, wherein the spacer and the first dielectric layer are used for facilitating self-aligned etching. A second conductive layer is formed over the semiconductor layer, surface of the second silicon oxide layer being exposed, and a second silicon oxide layer is formed over the second conductive layer and the first silicon oxide layer. Finally, a portion of the second silicon oxide layer is patterned to expose a portion of the second conductive layer, thereby forming the contact hole in the second oxide layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 3:
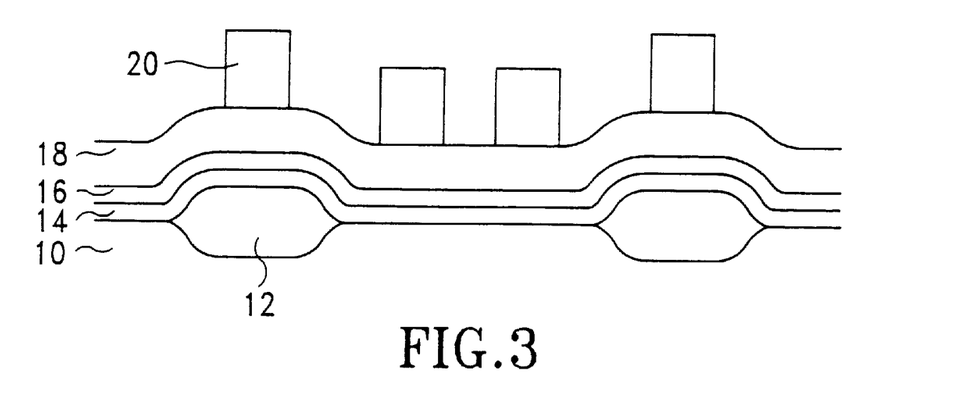
FIGS. 3–13 show cross-sectional views illustrative of various stages in the fabrication of a contact hole of a DRAM capacitor in accordance with one embodiment of the present invention.

Referring FIG. 3, a doped polysilicon layer 14 is formed on a semiconductor substrate 10 and field oxide (FOX) regions 12. In this embodiment, the polysilicon layer 14 is deposited using a standard low pressure chemical vapor deposition (LPCVD) process and is doped with phosphorus dopants at a concentration of about 5E20 atoms/cm$^3$. A silicide layer 16 is then formed using a conventional silicidation process. The combination of silicide layer 16 on top of the doped polysilicon layer 14 is usually referred to as polycide. It is appreciated that the polycide in this embodiment may be replaced by a single doped polysilicon layer although the latter has a higher resistivity than the former. On top of the silicide layer 16 is formed a dielectric layer 18, such as silicon nitride. In this embodiment, this silicon nitride layer 18 is formed by a standard low pressure chemical vapor deposition (LPCVD) to a thickness of about 1500–2500 angstroms.

Figure 4:
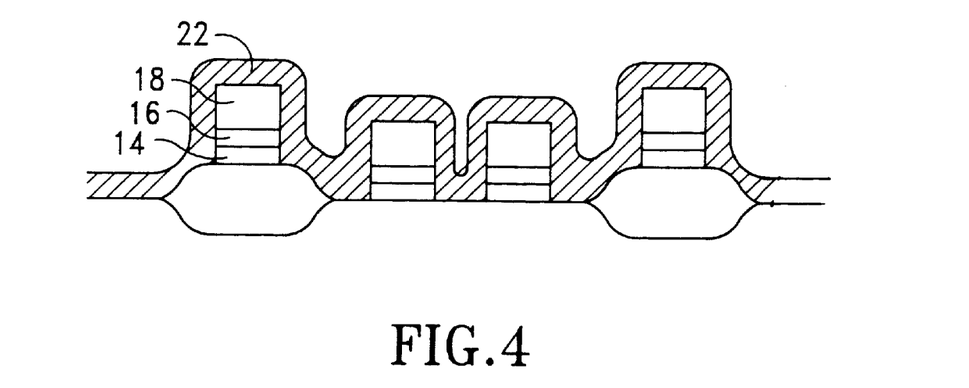

Conventional photolithography techniques are used to define gate areas in a photoresist layer 20 formed on the silicon nitride layer 18. Using the photoresist layer 20 as a mask, the silicon nitride layer 18, the silicide layer 16, and the doped polysilicon layer 14 are then etched, forming the structure shown in FIG. 4.

Figure 5:
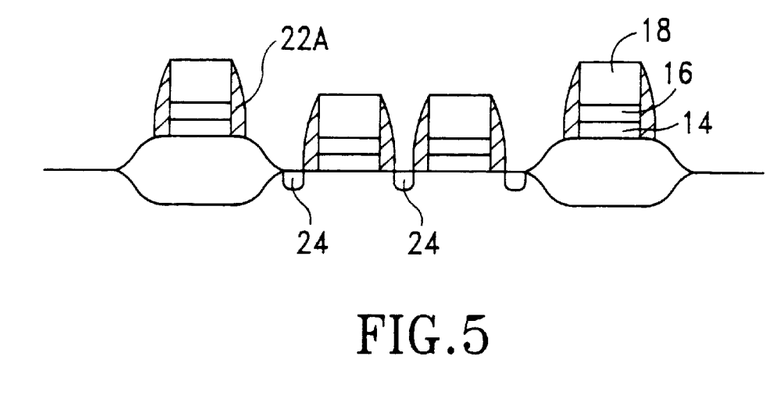

Next, a dielectric layer 22 such as a silicon nitride layer is blanket deposited over the substrate 10 and the silicon nitride layer 18. Thereafter, an anisotropic etch, preferably a reactive ion etch process is used to etch back the silicon nitride layer 22 so as to form spacers 22A on the sidewalls of the gate regions composed of the silicon nitride layer 18, the silicide layer 16, and the doped polysilicon layer 14 as shown in FIG. 5.

Figure 6:
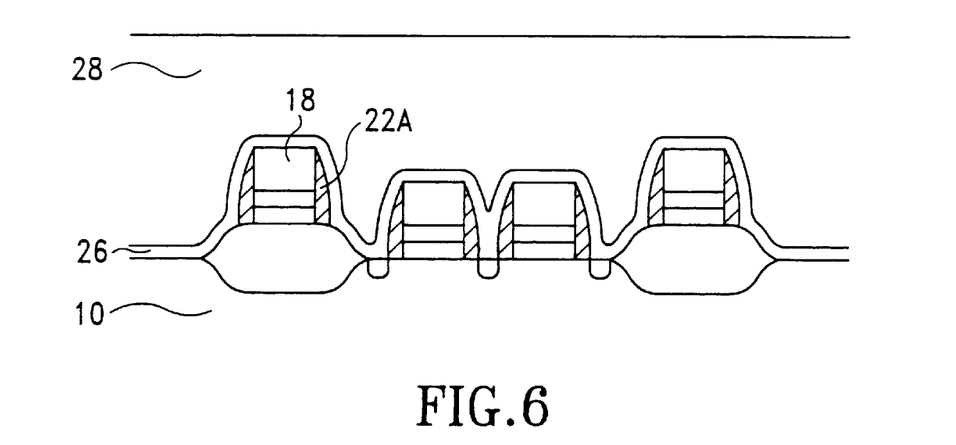

After the source/drain regions 24 are formed using a conventional ion implantation technique, a thin silicon oxide layer 26 is conformally formed over the spacers 22A, the silicon nitride layer 18, and the substrate 10 as shown in FIG. 6. The silicon oxide layer 26 is preferably deposited by a standard low pressure chemical vapor deposition (LPCVD) using tetraethylorthosilicate (TEOS) reaction gas. Over the thin silicon oxide layer 26 is blanket formed another silicon oxide layer 28 to a thickness of about 9000 angstroms. In the preferred embodiment, a borophosphosilicate glass (BPSG) is preferably used as the silicon oxide layer 28 due to its low reflow temperature. The thin silicon oxide layer 26 under the BPSG layer 28 is used as a barrier layer to prevent autodoping of boron (B) or phosphor (P) from the BPSG layer 28 down to the underlying devices.

Figure 7:
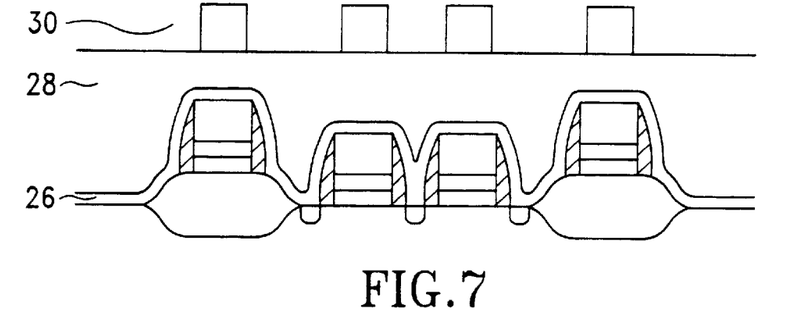

A conventional etch back or chemical-mechanical polishing (CMP) process is then performed to etch back a suitable thickness of the BPSG layer 28, thereby planarizing the surface of the BPSG layer 28 as shown in FIG. 7.

Figure 8:
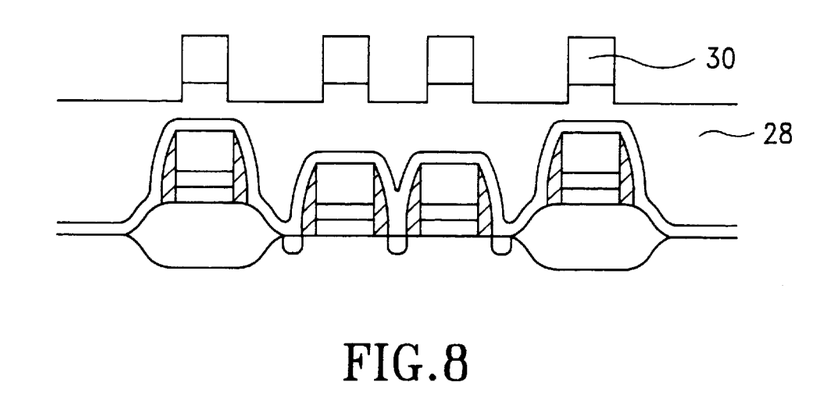

Conventional photolithography techniques are then used to define areas in a photoresist layer 30 formed on the BPSG layer 28 over a portion of each gate. Using the photoresist layer 30 as a mask, a portion of the BPSG layer 28 is then etched, resulting in the shallow trench in the BPSG layer 28 as shown in FIG. 8. The depth of the shallow trench in the BPSG layer 28 is preferably about 1000–3000 angstroms.

Figure 9:
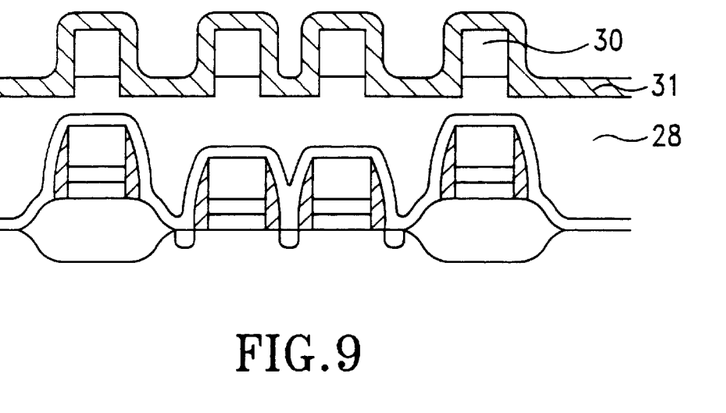

Referring to FIG. 9, a polymer layer 31 is conformally in-situ deposited on the BPSG layer 28 and the photoresist layer 30. In this embodiment, this polymer layer 31 is preferably formed by a plasma deposition method. It is noted that the shallow etching of the BPSG layer 28 as shown in FIG. 8 and the polymer layer 31 deposition in connection with FIG. 7 are preferably sequentially performed in the same chamber, such as in a RIE chamber, using $C_4F_8/CH_2F_2/CO/CHF_3/N_2/Ar$ gases.

Figure 10:
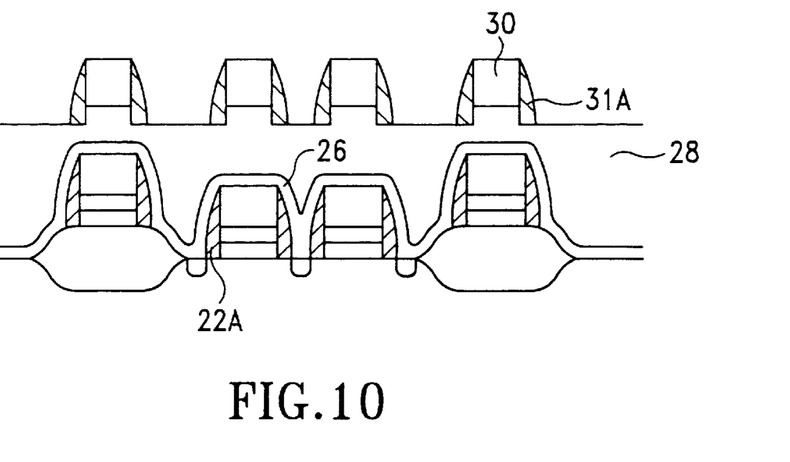
Figure 11:
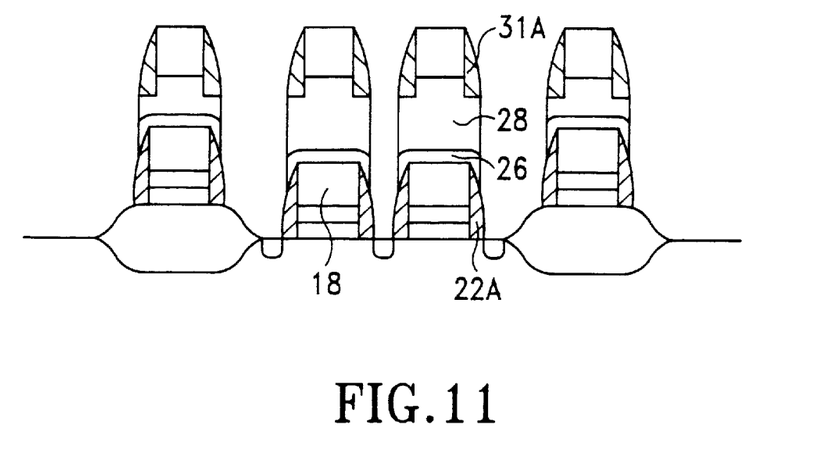

Thereafter, an anisotropic etch is used to etch back the polymer layer 31 so as to form polymer spacers 31A on the sidewalls of the BPSG layer 28 and the photoresist layer 30 as shown in FIG. 10. Using the polymer spacers 31A as a mask, the BPSG layer 28 and the thin silicon oxide layer 26 are etched, resulting in the structure shown in FIG. 11. It is observed that the spacers 22A and the silicon nitride layer 18 serve as a self-aligned contact (SAC) structure.

Figure 12:
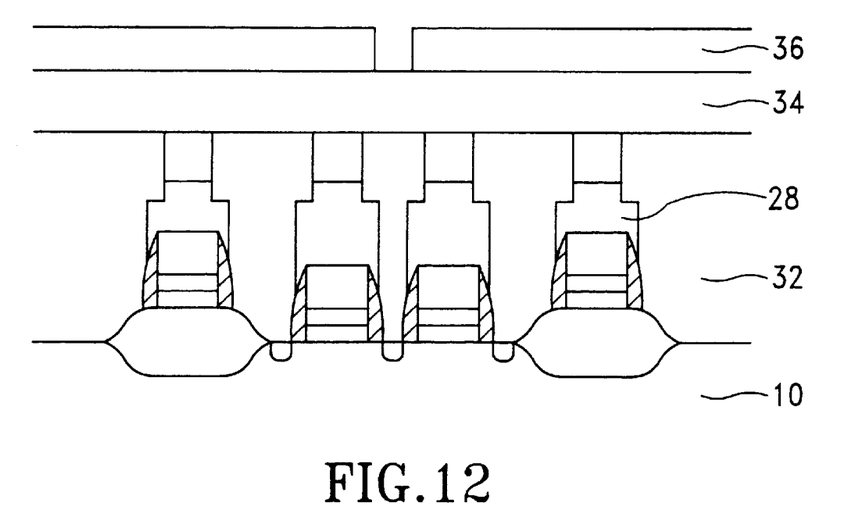
Figure 13:
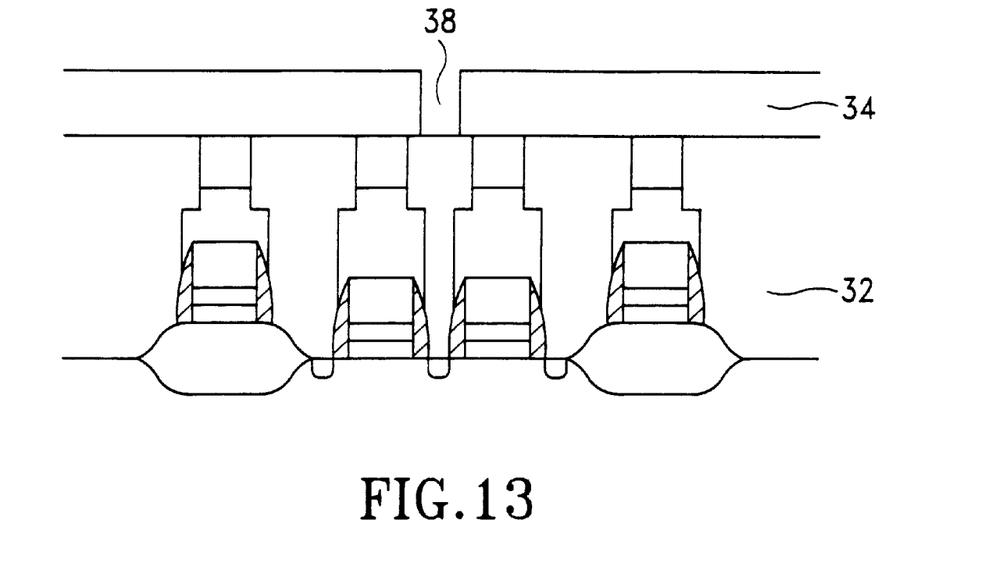

Referring to FIG. 12, after removing the polymer spacers 31A, a doped polysilicon layer 32 is deposited over the structure in FIG. 9, followed by an etching back or chemical mechanical polishing (CMP) until the surface of the BPSG layer 28 is exposed. Polysilicon contact plugs 32 are therefore formed over the exposed substrate 10. Next, a silicon oxide layer 34 is deposited over the polysilicon contact plugs 32, the photoresist, and the BPSG layer 28. In this embodiment, a borophosphosilicate glass (BPSG) is preferably used as the material of the silicon oxide layer 34. Conventional photolithography techniques are then used to define a contact hole in a photoresist layer 36 formed on the silicon oxide layer 34. Using the photoresist layer 36 as a mask, a bit-line contact hole 38 is formed by etching the silicon oxide layer 34, wherein the polysilicon contact plug 32 serves as the end point as shown in FIG. 13. It is noted that the contact hole 38 has an increased landing area (about twice, 200%, top $\phi 0.35$ $\mu$m) larger than that obtained using conventional methods (about $\phi 0.25$ $\mu$m).

Due to ion bombardment, a large contact open results in a poor silicon nitride (SiN) selectivity. It is appreciated that the present invention of forming a contact hole with large contact area at the top of plug and relatively small area during the second step, i.e., self-aligned to silicon nitride (SiN), of etching to increase its selectivity as described above is not limited to the aforementioned embodiment. In other words, the present invention may be applied to other semiconductor devices requiring a large contact area with high selectivity in self-aligned etching.

Although specific embodiments have been illustrated and described, it will be obvious to those skilled in the art that various modifications may be made without departing from the spirit which is intended to be limited solely by the appended claims.

What is claimed is:

1. A method for forming a contact hole of a semiconductor device, said method comprising:

forming a first conductive layer on a semiconductor layer;

forming a first dielectric layer on said first conductive layer;

patterning and etching said first dielectric layer and said first conductive layer to form a gate structure;

forming a second dielectric layer on said semiconductor layer and said gate structure;

anisotropically etching back said second dielectric layer to form spacers on the sidewalls of said gate structure;

forming a first silicon oxide layer over said semiconductor layer, said spacers, and said gate structure;

forming a photoresist layer on the first silicon oxide layer, said photoresist layer aligned with said gate structure;

removing a thickness of said first silicon oxide layer by using said photoresist layer as a mask;

forming a polymer layer on said photoresist layer and said first silicon oxide layer;

anisotropically etching back said polymer layer to form polymer spacer on the sidewalls of said photoresist layer and said first silicon oxide layer;

anisotropically etching back said first silicon oxide layer by using said polymer spacer as a mask until said semiconductor layer is exposed, wherein said spacer and said first dielectric layer are used for facilitating self-aligned etching;

removing said polymer spacer;

forming a second conductive layer over the semiconductor layer;

forming a second silicon oxide layer over said second conductive layer and said first silicon oxide layer; and patterning and etching a portion of said second silicon oxide layer to expose a portion of said second conductive layer, thereby forming the contact hole in said second oxide layer.

2. The method according to claim 1, wherein said first conductive layer comprises polycide.

3. The method according to claim 1, wherein said first and second dielectric layer comprise silicon nitride.

4. The method according to claim 1, wherein said first silicon oxide layer comprises borophosphosilicate glass (BPSG).

5. The method according to claim 4, further comprising etching back said first silicon oxide layer.

6. The method according to claim 4, further comprising forming a barrier silicon oxide layer before forming said first silicon oxide layer to serve as a barrier layer.

7. The method according to claim 1, wherein said second conductive layer comprises doped polysilicon.

8. The method according to claim 1, wherein said second silicon oxide layer comprises borophosphosilicate glass (BPSG).

9. The method according to claim 1, wherein said polymer layer and said photoresist layer are formed in a same chamber.

10. The method according to claim 1, wherein said polymer layer is formed by a plasma deposition process.

11. A method for forming a contact hole of a capacitor of a dynamic random access memory, said method comprising:

forming a first conductive layer on a semiconductor substrate;

forming a first dielectric layer on said first conductive layer;

patterning and etching said first dielectric layer and said first conductive layer;

forming a second dielectric layer on said semiconductor substrate and said first dielectric layer;

anisotropically etching back said second dielectric layer to form a spacer on sidewalls of said first dielectric layer and said first conductive layer;

forming a first silicon oxide layer over said semiconductor substrate, said first dielectric layer, and said spacer;

forming a photoresist layer on the first silicon oxide layer;

removing a thickness of said first silicon oxide layer by using said photoresist layer as a mask;

forming a polymer layer on said photoresist layer and said first silicon oxide layer, wherein said polymer layer and said first silicon oxide layer are formed in the same process chamber;

anisotropically etching back said polymer layer to form a polymer spacer on sidewalls of said photoresist layer and said first silicon oxide layer;

anisotropically etching back said first silicon oxide layer by using said polymer spacer as a mask to expose surface of said semiconductor substrate, wherein said spacer and said first dielectric layer are used for facilitating self-aligned etching;

removing said polymer spacer;

forming a second conductive layer over the semiconductor substrate, surface of said first silicon oxide layer being exposed;

forming a second silicon oxide layer over said second conductive layer and said first silicon oxide layer; and patterning to etch a portion of said second silicon oxide layer to expose a portion of said second conductive layer, thereby forming the contact hole of the capacitor.

12. The method according to claim 11, wherein said first conductive layer comprises polycide.

13. The method according to claim 11, wherein said first and second dielectric layer comprise silicon nitride.

14. The method according to claim 11, wherein said first silicon oxide layer comprises borophosphosilicate glass (BPSG).

15. The method according to claim 14, further comprising etching back said first silicon oxide layer.

16. The method according to claim 14, further comprising forming a silicon oxide layer before forming said first silicon oxide layer to serve as a barrier layer.

17. The method according to claim 11, wherein said second conductive layer comprises doped polysilicon.

18. The method according to claim 11, wherein said second silicon oxide layer comprises borophosphosilicate glass (BPSG).

19. The method according to claim 11, wherein said polymer layer is formed by a plasma deposition process.

* * * * *

UNITED STATES PATENT AND TRADEMARK OFFICE
CERTIFICATE OF CORRECTION

PATENT NO. : 6,103,588
DATED : August 15, 2000
INVENTOR(S) : E.S. Jeng et al.

It is certified that error appears in the above-identified patent and that said Letters Patent is hereby corrected as shown below:

COLUMN      LINE

4               40          "polymer spacer" should read --a polymer spacer--
(Claim 1,    line 21)

4               59          "layer" should read --layers--
(Claim 3,    line 2)

6               19          "layer" should read --layers--
(Claim 13,   line 2)

Signed and Sealed this

Twenty-ninth Day of May, 2001

Attest:

NICHOLAS P. GODICI

Attesting Officer        Acting Director of the United States Patent and Trademark Office